United States Patent [19]

Martin et al.

[11] 4,304,681

[45] Dec. 8, 1981

[54] NOVEL STRIPPING COMPOSITION FOR POSITIVE PHOTORESISTS AND METHOD OF USING SAME

[75] Inventors: Robert L. Martin; George A. Gibson, both of Framingham, Mass.

[73] Assignee: Shipley Company, Inc., Newton, Mass.

[21] Appl. No.: 187,465

[22] Filed: Sep. 15, 1980

[51] Int. Cl.[3] .......................... B08B 3/08; C09D 9/00; C09D 9/04; C23D 17/00

[52] U.S. Cl. ........................................ 252/143; 134/3; 134/38; 134/42; 156/659.1; 156/661.1; 156/904; 252/171; 252/549; 252/558; 252/DIG. 8; 430/315

[58] Field of Search .......... 252/143, 171, 558, DIG. 8; 134/38, 42, 3; 156/904, 659.1, 661.1; 430/329, 315, 331

[56] References Cited

U.S. PATENT DOCUMENTS 3,813,309 5/1974 Bakus et al. ...................... 134/38 X
4,165,294 8/1979 Vandermey ........................ 252/143
4,165,295 8/1979 Vandermey ........................ 252/143

*Primary Examiner*—Dennis L. Albrecht

*Attorney, Agent, or Firm*—Robert L. Goldberg

[57] ABSTRACT

A novel stripping composition and method of using same is disclosed, which stripping composition comprises:

(a) a solvent comprising one or more compounds of formula (I)

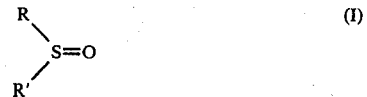

wherein R and R' are each selected independently from straight and branched alkyl having 1 to 3 carbon atoms, and phenyl, each of which phenyl is optionally substituted with one or more hydroxyl, or R and R' together are alkylene of 3 to 6 carbon atoms; and (b) a suitable organosulfonic acid.

The stripping composition is especially useful for stripping positive photoresists faster and at lower temperatures than known strippers. A preferred composition comprises 10% by weight para-toluenesulfonic acid in dimethyl sulfoxide.

12 Claims, No Drawings

NOVEL STRIPPING COMPOSITION FOR POSITIVE PHOTORESISTS AND METHOD OF USING SAME

BACKGROUND OF THE INVENTION

1. Field of the Invention

This invention relates to a novel stripping solution and its use for removing positive photoresist from the surface of an inorganic substrate.

2. Brief Description of the Prior Art

Where a pattern is to be formed on an inorganic substrate, such as metallic circuitry in the manufacture of printed circuit boards and integrated circuits, it can either be put down selectively in the appropriate areas such as by electroplating, or put down over the entire substrate and selectively removed by chemical etching. A method well known in the art of effecting such selective action involves forming a layer of resist over the substrate (or metal-coated substrate, hereafter referred to collectively with non-metal-coated substrate as "substrate"), in those areas to be shielded from metal deposition (or metal removal). Typically, the resist layer can be formed of a polymeric organic substance which is substantially unaffected by the metal deposition (or metal removal) process, and thus is able to protect the underlying areas of the substrate. For this purpose, various photoresists are known, that is, substances which form the desired masking pattern on the substrate upon exposure to activating light through a photographic image.

Photoresists are generally of two types, positive photoresists and negative photoresists. Prior to exposure to activating light, x-ray or electron beam radiation, a positive resist is insoluble in a developer solution. Upon exposure, the light-struck portion of the photoresist becomes soluble in the developer while the unexposed areas remain insoluble. Upon development, usually in aqueous basic solution, the solubilized portions are removed, leaving the insoluble portions of the resist layer on the substrate in the pattern of the photographic image.

Negative acting photoresists are chemically distinct from positive resists, and become insolubilized upon exposure to activating light. Negative photoresists are, for example, cyclicized rubber-based resists, while positive photoresists typically comprise, for example, a novolak, resin rendered insoluble in base solution by incorporating light-sensitive material. Upon exposure to actinic radiation, the light-sensitive material is chemically altered, and no longer protects the resist from dissolving in the developer. Other types of both positive and negative photoresists are also known.

Subsequent to putting down (or etching away) metal or oxide layers on the exposed portions of the substrate, the resist layer must be removed. The removal process must not adversely affect either the substrate or the metal layer. The substrate can be silicon dioxide coated silicon wafer, as in the manufacture of semiconductor microcircuitry and the metallic microcircuitry is typically aluminum or aluminum alloy. Other materials used in I.C. manufacture, or used for example in the manufacture of printed circuit boards, include a wide variety of inorganic substrate materials such as garnet crystal, L.E.D. and L.C.D. surfaces; e.g., indium oxide, iron oxide, chrome and virtually every other metal. The means employed for stripping the resist must act without corroding, dissolving, or dulling the surface of such materials, and without chemically altering the material forming the substrate.

Prior art methods for removing positive photoresists include the use of organic stripping compositions comprising phenol and linear alkyl benzene sulfonic acids, as exemplified in U.S. Pat. No. 3,871,929. Other known organic stripping compositions contain organic sulfonic acids of the formula $R—SO_3H$, wherein R is an organic radical, organic solvent, fluoride ion and optionally, phenol, as disclosed in U.S. Pat. No. 4,165,295.

Prior art inorganic stripping compositions include aqueous sulfuric acid compositions containing fluoride ion, as exemplified in U.S. Pat. No. 3,932,130, U.S. Pat. No. 3,654,001 and U.S. Pat. No. 3,080,071.

The above-mentioned inorganic stripping compositions are disadvantaged by their tendency to cause undesirable etching of silicon dioxide substrates, which effect is likely caused by their fluoride ion content. The above-mentioned organic stripping compositions have the disadvantage of producing undesirable dulling of the surface of aluminum circuitry put down on the substrate, or of causing undesirable etching of silicon dioxide substrate. Stripping compositions containing phenolics are significantly disadvantageous in that phenolics are toxic, poorly waste-treatable, and can actually lower stripping efficiency when employed in compositions for stripping positive-type photoresists. The use of phenol-type strippers is rapidly becoming untenable due to environmental considerations. [L. H. Kaplan and B. K. Bergin, *J. Electrochemical Soc.*, 127, 386 (1980).]

Many prior known stripping compositions are disadvantaged in being insufficiently effective against certain resists. In particular, known stripping compositions are insufficiently effective against those resists which, during the course of device manufacture, have been subjected to elevated temperatures, such as during exceptionally high temperature post-bake, to high-energy processing, such as during ion implantation steps, or to exceptionally harsh chemical environments, such as platinum and mesa etch. This decreases their usefulness generally, and restricts the flexibility of processing lines in which they are used.

Certain known stripping solutions for positive photoresists are opaque or have coloration which prevents their use in stripping processes employing automatic end point determination.

It is an object of the present invention to provide a stripping composition which efficiently removes positive-type photoresist. In this regard, it is a further object to provide a stripping solution which removes the resist layer but does not significantly adversely affect the metal layer or the inorganic substrate including, for example, substrates of silicon, silicon dioxide (thermal or sputter grown), and polysilicon, and aluminum and aluminum alloy.

It is another object of the present invention to provide a stripping composition which readily removes ion-implanted positive photoresist films.

It is another object of the present invention to provide a stripping composition which is optically clear and free from coloration and which therefor lends itself to automatic end point detection.

It is another object of the present invention to provide a stripping composition which does not contain either fluoride ion, or phenolic compounds or other substances difficult to waste-treat.

It is another object of this invention to provide a stripping composition which is a liquid at room temperature.

It is another object of the present invention to provide a method for stripping positive-type photoresists from inorganic substrates, including metalized substrates, particularly in the manufacture of integrated circuitry and printed circuit boards.

SUMMARY OF THE INVENTION

Accordingly, the present invention provides a new stripping composition for removing positive photoresists from a substrate, which stripping solution comprises:

(a) a solvent having the formula (I)

(I)

wherein R and R' are each selected independently from straight and branched alkyl having one to three carbon atoms, and phenyl, each of which phenyl is optionally substituted with one or more hydroxyl, or R and R' together can be alkylene of 3 to 6 carbon atoms; and (b) a suitable organosulfonic acid.

Also in accordance with the invention, there is provided a method for stripping positive photoresist from a substrate, such as inorganic substrate, which method comprises contacting the positive photoresist with the novel stripping composition of the invention at a temperature of from about 20° to 150° C., preferably 75°-100° C., most preferably 80°-90° C., for a time sufficient to remove the resist layer.

DETAILED DESCRIPTION

The novel stripping solution of this invention is unique in its simplicity of composition and its surprising excellent efficacy in stripping positive photoresists. It comprises a highly polar, water soluble sulfoxide solvent according to formula (I):

(I)

wherein R and R' are as defined above. The sulfoxide solvent of the present invention can comprise, for example, one or more of dipropylsulfoxide, diethylsulfoxide, methylethylsulfoxide, diphenylsulfoxide, methylphenylsulfoxide and 1,1'-dihydroxyphenyl sulfoxide. Those sulfoxide solvents which are liquid at room temperature are preferred since these provide a significant advantage in ease of manufacturing and using the stripping composition. Also preferred are the sulfoxide solvents of the invention which are water miscible, since work pieces stripped in stripping compositions employing same are water-rinseable with consequent cost savings and ease of process design.

Most preferably, the sulfoxide solvent is dimethylsulfoxide (DMSO) due to its high polarity, low cost, non-toxicity, and ease of waste treatment.

While the sulfoxide solvents of the invention will themselves provide some stripping action for positive resists, it has now been discovered that the rate of stripping is greatly enhanced by the addition of suitable organosulfonic acid. Organosulfonic acids suitable for use in the present stripping solution include those sufficiently soluble in the sulfoxide solvent. As used in this regard, sufficiently soluble means soluble to at least about 1%, and preferably at least about 5% by weight of solvent.

Preferred organosulfonic acids include those of formula (II):

(II)

wherein Q is alkyl, aryl, arylalkyl, monoalkylaryl or dialkylaryl, wherein any alkyl and aryl moiety is optionally substituted with one or more halogen, hydroxy, methoxy and nitro. Exemplary organosulfonic acids include methane sulfonic acid, ethane sulfonic acid, benzene sulfonic acid and dodecylbenzene sulfonic acid.

Suitable organosulfonic acids also include organopolysulfonic acids. Exemplary organo-polysulfonic acids include benzene disulfonic acid such as benzene -1,3-disulfonic acid, and naphthalene di- and polysulfonic acid. The organosulfonic acid can also comprise a sufficiently soluble polysulfonated polymeric material, including copolymers, terpolymers, etc. Exemplary polymeric materials include those comprised of styrene, vinyl toluene, divinyl benzene and like monomers. The polymeric material can be polysulfonated according to methods known in the art, either subsequent to polymerization or by employihg monomers at least a substantial portion of which are sulfonated.

Other suitable organosulfonic acids will be readily apparent to the skilled of the art. The most preferred organosulfonic acid is para-toluene sulfonic acid (p-TsOH), in view of its wide commercial availability, low cost, and high solubility in the sulfoxide solvents of the invention.

A significant advantage of the present invention relates to the stripping rate provided by the novel stripping composition. More specifically, the stripping rate has been found to be substantially constant over a broad range of concentration of organosulfonic acid in the sulfoxide solvent. It has been discovered, for example, that concentrations from 5% or less, up to 40% or more of para-toluene sulfonic acid in DMSO, provide a substantially uniform initial rate of resist removal. The present invention most preferably comprises about 5% to 20% by weight organosulfonic acid. The higher concentrations provide cost advantages and an extended working life for the stripping solution, while the lower concentrations provide reduced attack on substrate.

The novel stripping composition of the invention provides a significant advantage also in regard to waste treatment, since the preferred embodiments do not contain phenolic compounds. In addition, the preferred sulfoxide solvents employed in the stripping composition of the invention are liquid at room temperature, thereby greatly facilitating handling, and are miscible with numerous solvents including, for example, water, alcohol, xylene, acetone, and ethylacetate. Moreover, the substantial absence of metal ion content in the sulfoxide solvent and the organosulfonic acid (metal ion being present generally only as an impurity), preclude contamination of substrates by these ions during the stripping process, and also renders the stripping composition more easily waste treatable. In addition, the absence of fluoride ion precludes attack by the present stripping solution on oxide surfaces.

The present stripping composition effectively removes positive photoresists faster and at a lower termperature than any known organic stripping composition. Moreover, the rate of attack on metals such as aluminum, oxides and other inorganic substrate materials, including silicon and silicon dioxide, has been found to be significantly less than that of other stripping compositions.

Other ingredients can be added to the novel stripping solution to adapt it to particular applications, such as dyes or colorants, or a wetting agent of which many are known to the skilled of the art. However, for typical applications such as in the manufacture of integrated circuits employing aluminum over silicon and silicon dioxide substrates, and in the manufacture of printed circuit boards, the addition of a wetting agent has not been found to be necessary and has not been observed to significantly affect the efficacy of the stripping solution.

Where the positive photoresist is soft-baked after development, that is where the casting solvents are driven off at temperatures of about 90° C., but the resist resin components remain otherwise substantially unaltered, and the present stripping composition can be used effectively even at temperatures as low as room temperature. Where the resist is hard-baked (120°–200° C.), whereby in typical positive photoresists thermal crosslinking occurs in the resin, the present stripping solution can be used most effectively at temperatures of about 50°–150° C., and preferably is used at about 80°–90° C. Lower temperatures can be used with longer stripping periods.

Most surprisingly, the novel stripping compositions of the invention have been discovered to be highly effective for stripping positive photoresists even when used in conjunction with ion-implanting techniques in the manufacture of integrated circuits. Other known stripping compositions require much longer, often many hours longer, to strip such resists, and often do not remove the resist at all. Using the present stripping composition, the resist is removed cleanly and without residue, and a simple water rinse completely removes the stripping solution from the work piece.

In addition to the novel stripping composition, the present invention provides a method of using it to remove a positive photoresist from a substrate. In a preferred mode of operation, a device to be stripped of positive photoresist is immersed in the novel stripping solution of the invention, which solution can be at a temperature as low as room temperature (20° C.), but typically is between about 50°–150° C., preferably 80°–90° C. The stripping solution can be stirred or otherwise agitated. The device is contacted with the stripping solution either continuously, which is peferred, or intermittently, typically for sufficient time to completely remove the resist. In an alternate mode of operation, the device to be stripped of resist can be contacted with the stripping composition as a spray.

It should be noted that the stripping method and stripping composition of the invention are not limited to the foregoing temperature or concentration ranges, but rather will be effective, though perhaps less so, outside those preferred ranges.

With regard to the concentration of organosulfonic acid, any concentration from above 0% to saturation can be used. However, solutions having very low concentration of organosulfonic acid will be more quickly exhausted and lose efficiency, while solutions of concentrations above about 40% can result in attack on metals and other substrate materials.

The novel stripping composition of the present invention provides another surprising advantage, since in contrast to its excellent efficacy in the removal of positive photoresists, it does not significantly remove certain materials, such as poly-imides and "cyclized rubber" resists. Accordingly, the present stripping solutions can be used to remove one or more layers of positive resist while leaving intact over the substrate one or more layers of such materials. Thus, this novel stripping solution can be used in conjunction with bi-layer and multi-layer masking techniques to simplify and improve the manufacture of, for example, integrated circuits and printed circuit boards.

It should be understood that while the novel stripping composition of the present invention are most notable for their surprising efficacy in stripping positive photoresist, there is no intent to exclude from the scope of the invention its use to strip any negative photoresist or other masking layer strippable by the stripping composition.

It will be readily apparent to the skilled in the art that more than one suitable organsulfonic acid can be employed together in the stripping composition and, likewise, more than one solvent can be used without departing from the invention. It will also be readily understood that the term solvent is used to refer to the sulfoxide component, since it is generally present in larger amount than is the organosulfonic acid. In some less preferred embodiments, however, the organosulfonic acid might be a liquid at room temperature and the sulfoxide component a solid.

It should be understood that the present disclosure is for the purpose of illustration only; the invention includes all modifications and improvements which fall within the scope of the claims.

The following examples illustrate the invention and are not to be considered as limitations on the scope thereof.

EXAMPLE 1

Silicon dioxide coated silicon wafers, 3' diameter, were coated with approximately 1.5 μm thickness of AX-1350J photoresist (Shipley Co., Newton, Mass.), using conventional techniques. Two solutions were prepared, the first consisting of dimethyl sulfoxide (DMSO), and the second consisting of a 10% solution of para-toluene sulfonic acid in DMSO (10% p-TsOH).

Both were maintained at 80° C. with constant stirring by magnetic stirrer. The minimum stripping time for each was observed to be as follows:

| DMSO | 10% p-TsOH |
| --- | --- |
| 5–6 mins. | 3 mins. |

EXAMPLE 2

Silicon dioxide-coated silicon wafers were coated as described in Example 1. Three 2-liter stripping solutions in accordance with the present invention were made up, consisting of 1%, 5% and 10%, respectively, of paratoluene sulfonic acid (p-TsOH) in dimethyl sulfoxide. Each stripping solution was maintained at approximately 80° C., and stirred constantly. The wafers were divided into three groups of 10 each which were then stripped, one each in the three solutions for a period of three minutes with constant agitation. The results are shown in Table I.

TABLE I

| Wafer No. | Stripping Solution | | |
|---|---|---|---|
| | 1% p-TsOH | 5% p-TsOH | 10% p-TsOH |
| 1 | clear | clear | clear |
| 2 | clear | clear | clear |
| 3 | clear | clear | clear |
| 4 | clear | clear | clear |
| 5 | clear | clear | clear |
| 6 | clear | clear | clear |
| 7 | clear | clear | clear |
| 8 | clear | clear | clear |
| 9 | clear | clear | clear |
| 10 | clear | clear | clear |

EXAMPLE 3

Stripping solutions were prepared according to the present invention, consisting of para-toluene sulfonic acid (p-TsOH) in dimethyl sulfoxide (DMSO). Each solution was maintained at approximately 80° C. during stripping. Silicon wafers, prepared as in Example 1, were stripped in each of these solutions. The observed minimum stripping times for each solution are shown in Table II.

TABLE II

| Solution No. | p-TsOH Percent Ratio | Minimum Stripping Time (minutes) |
|---|---|---|
| 1 | 0% | 5, 6, 7 |
| 2 | 0.1% | 6, 7, 7, 9 |
| 3 | 1% | 3, 5, 5 |
| 4 | 2% | 4, 4, 5 |
| 5 | 5% | 3, 4, 6 |
| 6 | 10% | 3, 3, 4, 4, 5 |
| 7 | 25% | 4.5 |
| 8 | 40% | 5 |

EXAMPLE 4

Tests were run to determine the efficacy of the novel stripping composition of the present invention in use with various commercially available positive and negative photoresists. A stripping solution was prepared consisting of 10% p-TsOH in DMSO. The solution was maintained at 80°±5° C. Silicon wafers with 8000 Å of freshly grown thermal oxide were coated with photoresist according to the schedule in Table III. The various resists used are listed by their commercial designation, and each is identified as being either a positive ("+") or negative ("−") photoresist.

TABLE III

| Wafer No. | Resist Type | Photoresist | 30 Sec. Spin Speed | Softbake (10 min.) | Postbake (15 min.) | Resist Thickness (μm) |
|---|---|---|---|---|---|---|
| 1. | + | Kodak 809 32% | 3000 RPM. | 85° C. | none | 1.6 |
| 2. | + | Kodak 809 32% | 3000 RPM. | 85° C. | none | 1.6 |
| 3. | + | Hunt 204 | 3000 RPM. | 105° C. | 125° C. | 1.4 |
| 4. | + | Hunt 204 | 3000 RPM. | 105° C. | 125° C. | 1.4 |
| 5. | + | Hunt 206 | 3000 RPM. | 105° C. | 125° C. | 1 |
| 6. | + | Hunt 206 | 3000 RPM. | 105° C. | 125° C. | 0.96 |
| 7. | − | Kodak 747 | 5000 RPM. | 90° C. | 130° C. | 1.2 |
| 8. | − | Kodak 747 | 5000 RPM. | 90° C. | 130° C. | 1.2 |
| 9. | − | Hunt IC | 5000 RPM. | 65° C. | 135° C. | 1.3 |

The wafers were then stripped. The results are given in Table IV.

TABLE IV

| Wafer | Resist Type | Photoresist | Thickness (μm) | Stripping Time | Stripping Rate (μm Min.) |
|---|---|---|---|---|---|
| 1. | + | Kodak 809 | 1.6 | 3 min. | * |
| 2. | + | Kodak 809 | 1.6 | 2 min. | 0.8 |
| 3. | + | Hunt 204 | 1.4 | 2 min. | * |
| 4. | + | Hunt 204 | 1.4 | 1 min. | 1.4 |
| 5. | + | Hunt 206 | 1 | 1 min. | 1 |
| 6. | + | Hunt 206 | 0.96 | 1 min. | 0.96 |
| 7. | − | Kodak 747 | 1.5 | approx. 15 min. loosening of resist film, but no stripping. | |
| 8. | − | Kodak 747 | 1.2 | 9 min. loosening of resist film, but no stripping. | |
| 9. | − | Hunt 1C | 1.3 | 20 min. | No stripping. |

*resist totally removed before end of stripping time.

EXAMPLE 5

The following stripping solutions were prepared:

| 1. | DMSO | 450 ml |
|---|---|---|
| | Methane sulfonic acid | 50 ml |
| 2. | DMSO | 450 ml |
| | Benzene sulfonic acid | 50 ml |

Each was maintained at 80° C. Silicon wafers were coated with positive photoresist AZ 1350J (Shipley Co., Newton, Mass.), according to the manufacturer's directions (softbake at 90° C. for 25 min., postbake at 175° C. for 25 min.). The resist thickness was determined to be approximately 1.6 μm for each. The coated wafers were divided into two groups. Each group was stripped in one of the two stripping solutions. The time required to strip the wafers was less than 3 min. for each solution.

EXAMPLE 6

Silicon wafers, prepared as in Example 2, were used to compare the stripping composition of the invention with known, commercially available strippers. A stripper solution consisting of 10% p-TsOH in DMSO was used at 80° C. The commercially available stripping solution, Burmar 712D (E.K.C. Chemical Corp., San Francisco, Calif. a solution of methane sulfonic acid and phenol in a chlorinated hydrocarbon solvent), was used at the manufacturer's recommended bath temperature of 90°–100° C. The commercially available stripper solution, J-100 (Indust-Ri-Chem Laboratory, Richardson, Tex. a mixture of phenols and cresols in a chlorinated hydrocarbon solvent), was used at the manufacturer's recommended temperature of 90° C. The observed superior stripping rate of the stripper solutions of the invention and its lower operating temperature are shown in Table V.

TABLE V

| Stripper Solution | Operating Temperature | Stripping Rate (μm/min.) |
|---|---|---|
| 10% p-TsOH in DMSO | 80° C. | 0.7 |
| Burmar 712D | 90° C.-100° C. | 0.1 |
| J-100 | 90° C. | 0.4 |

EXAMPLE 7

Aluminized 2" by 2" glass plates were immersed in either of two stripping solutions to compare the rate of attack on the aluminum. The first solution consisted of 10% p-TsOH in DMSO, operated at 80° C. The second was Burmar 712D (E.K.C. Chemical Corp., San Francisco, Calif.), operated at the manufacturer's recommended temperature. The results are presented in Table VI. The rate of attack listed for the stripper solution of the invention represents essentially no detactable attack.

TABLE VI

| Stripper Solution | Temperature | Rate of Attack |
|---|---|---|
| 10% p-TsOH in DMSO | 80° C. | 0.1 A/min. |
| 712D | 95° C. | 4 A/min.* |

*manufacturer's data.

EXAMPLE 8

Stripper solutions were prepared as in Example 7, and tested to determine the minimum time required by each to remove 1.6 μm of ion-implanted positive photoresist AZ-1350J (Shipley Company, Newton, Mass). The results are presented in Table VII and Table VIII, which list the accelerating energy and ion density used. The asterisk indicates that a 15 sec. rinse in isopropyl alcohol was used after the stripping solution.

TABLE VII

Minimum Stripping Time for Positive Resist (Ion Implantation at 100 KeV Accelerating Energy)

| Ion Density Ions/cm² | 90° C. 10% p-TsOH in DMSO | 95° C. J-100 | 95° C. Burmar 712D |
|---|---|---|---|
| 10¹¹ | 1 minute* | 2 minutes | 1½ minutes |
| 10¹² | 1 minute* | 2 minutes | 1½ minutes |
| 10⁻ | 1 minute* | 2 minutes | 2 minutes |
| 10¹⁴ | 14 minutes | 55 minutes | 75 minutes |
| 10¹⁵ | 20 minutes | over 210 minutes | 170 minutes |

TABLE VIII

Minimum Stripping Time for Positive Resist (Ion Implantation at 5 × 10¹³ ions/cm²)

| Accelerating Energy KeV | 90° C. 10% p-TsOH in DMSO | 95° C. J-100 | 95° C. Burmar 712D |
|---|---|---|---|
| 25 | 2 minutes* | 17 minutes | 17 minutes |
| 50 | 2¼ minutes* | 28 minutes | 25 minutes |
| 100 | 2¼ minutes* | 50 minutes | 40 minutes |
| 150 | 2½ minutes* | 65 minutes | 75 minutes |

We claim:

1. A novel stripping composition for stripping positive working photoresist from a substrate, comprising:
    (a) a solvent comprising one or more compounds of formula (I)

wherein R and R' are each selected independently from straight and branched alkyl having 1 to 3 carbon atoms, and phenyl, each of which phenyl is optionally substituted with one or more hydroxyl, or R and R' together are alkylene of 3 to 6 carbon atoms; and
    (b) a suitable organosulfonic acid.

2. The stripping composition of claim 1, wherein said organosulfonic acid is present in an amount of about from 5 to 40% by volume of said solvent.

3. The stripping composition of claim 1 wherein said organosulfonic acid is present in an amount of about 10% by volume of said solvent.

4. The stripping composition of claim 1 wherein said organosulfonic acid is selected from among those of formula (II)

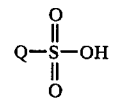

wherein Q is alkyl, aryl, arylalkyl, monoalkylaryl, or dialkylaryl, any said alkyl and aryl moiety being optionally substituted with one or more halogen, hydroxy, methoxy, and nitro.

5. The stripping composition of claim 1, wherein said organosulfonic acid is para-toluene sulfonic acid.

6. The stripping composition of claim 1, wherein said solvent is selected from the group comprising dimethyl sulfoxide and diethyl sulfoxide.

7. The stripping composition of claim 1, wherein said solvent comprises dimethyl sulfoxide.

8. The stripping composition of claim 1, wherein said solvent comprises dimethyl sulfoxide, and said organosulfonic acid comprises para-toluene sulfonic acid present in an amount of about 10% by weight of said solvent.

9. A method of stripping a positive working photoresist from a substrate comprising contacting said resist with a stripping composition comprising:
    (a) a solvent comprising one or more compounds of formula (I)

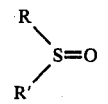

wherein R and R'' are each selected independently from straight and branched alkyl having 1 to 3 carbon atoms, and phenyl, each of which phenyl is optionally substituted with one or more hydroxyl, or R and R' together are alkylene of 3 to 6 carbon atoms; and
    (b) a suitable organosulfonic acid.

10. The method of claim 9 wherein said stripping composition is at about 20° to 150° C.

11. The method of claim 9 wherein said stripping composition is at about 80°-90° C.

12. The method of claim 9, 10 or 11, wherein said solvent is dimethyl sulfoxide and said organosulfonic acid is para-toluene sulfonic acid and is present in an amount of about 5 to 40% by weight of said solvent.

* * * * *